United States Patent [19]

Erlam et al.

[11] Patent Number: 4,511,199
[45] Date of Patent: Apr. 16, 1985

[54] CARD FRAME WITH CARD GUIDES AND CARDS GUIDED THEREIN

[75] Inventors: David P. Erlam; Arthur E. Carr, both of Winchester, England

[73] Assignee: Rittal-Werk Rudolf Loh GmbH & Co. KG, Fed. Rep. of Germany

[21] Appl. No.: 486,992

[22] Filed: Apr. 21, 1983

[30] Foreign Application Priority Data

Apr. 21, 1982 [GB] United Kingdom ............... 8211565

[51] Int. Cl.³ ........................................... H01R 13/62
[52] U.S. Cl. ................................................ 339/45 M
[58] Field of Search .................................... 339/45, 46

[56] References Cited

U.S. PATENT DOCUMENTS

| | | | |
|---|---|---|---|
| 3,476,258 | 11/1969 | Dorsett | 339/45 M |
| 3,784,954 | 1/1974 | Grimm et al. | 339/45 M |
| 4,083,616 | 4/1978 | McNiece et al. | 339/45 M |
| 4,233,646 | 11/1980 | Leung et al. | 339/45 M |
| 4,241,966 | 12/1980 | Gomez | 339/45 M |

FOREIGN PATENT DOCUMENTS 0068849 5/1983 United Kingdom .
0068850 5/1983 United Kingdom .

*Primary Examiner*—John McQuade
*Assistant Examiner*—David L. Pirlot
*Attorney, Agent, or Firm*—Thomas W. Speckman

[57] ABSTRACT

A card frame having a number of pairs of vertically spaced card guides for receiving cards provided with plug connectors. Each pair of card guides is associated with a socket connector to establish electrical contact. A double-armed lever is pivotally mounted on each card by means of a pin at the lower front corner of the card and is adapted to be pivoted from an initial position, which is oblique to the forward edge of the card, into a latching position in an abutting relationship with the forward edge of the card. The short lever arm terminates in a hook and heel configuration. The hook portion is engageable with a receptacle fixed on the frame, as the card is inserted and the lever is pivoted upward into the latching position, with the hook bearing against the receptacle counter to the direction of insertion of the card. The heel portion bears against a front surface area of the frame as the lever is pushed downward into its initial position and the card is ejected. Solely by the particular construction of the mounting means of the lever on the card and the location of mounting with respect to the hook at the end of the shorter lever arm, a definitive non-detachable fully plugged-in position of the card is attained.

11 Claims, 9 Drawing Figures

CARD FRAME WITH CARD GUIDES AND CARDS GUIDED THEREIN

BACKGROUND OF THE INVENTION

1. Field of the Invention

This invention relates to a card frame having a number of pairs of vertically spaced card guides for receiving cards (or also called boards) provided with plug connectors. Each pair of card guides is associated with a socket connector to establish electrical connection. A double-armed lever is pivotally mounted on each card by means of a pin at the lower front corner of the card and is adapted to be pivoted from out of an initial position, which is oblique to the forward edge of the card, into a latching position in an abutting relationship with the forward edge of the card. The short lever arm terminates in a hook and heel configuration. The hook portion is engageable with a receptacle fixed on the frame, as the card is inserted and the lever is pivoted upward into the latching position, with the hook bearing against the receptacle counter to the direction of insertion of the card. The heel portion bears against a front surface area of the frame as the lever is pushed downward into its initial position and the card is ejected by being levered outwards.

2. Description of the Prior Art

A card frame of the foregoing type is known from U.S. Pat. No. 4,083,616. The lever on the card serves to move the card into the fully plugged-in position, overcoming the insertion forces of the electrical connector whereby the insertion of the card is facilitated by the spaced bifurcated configuration of the lever while at the same time electrical connection is established. During the insertion movement, as the lever is moved upwardly, the hook on the lever bears against the fixed receptacle on the frame and the insertion forces, correspondingly translated, are transferred by the lever/pin assembly to the card. The situation is similar during the ejection of the card and the ensuing disconnection of the plug and socket connector. As the card is being withdrawn, the heel of the lever bears against the front portion of the frame and a correspondingly translated retraction force is transferred to the card as the lever is pivoted downward into the initial position.

In this known card frame, the fully plugged-in position of the card can be maintained only by resilient latching elements of the lever which exert a clamping action on each side of the card in the latched position of the lever. However, this clamping action can be overcome by applying an appropriate force to the card so that the card can be pulled out.

As is disclosed in U.S. Pat. No. 4,313,150, the latching position of the lever may be improved by a latching connection. To this end, however, the card must be provided with an aperture into which the projections of the lever may be snapped.

SUMMARY OF THE INVENTION

It is the object of the present invention to provide a card frame of the foregoing type, in which the cards are definitively locked into their fully plugged-in position without the need for holes in the card, so that even with great tensional forces acting on the card the fully plugged-in position of the card will not be affected.

This is accomplished according to the invention in that the lever is additionally adjustably mounted by providing arcuate slots for the pin to move in. In the initial position of the lever, the pin bears against the upper end of the slot, and in the latching position of the lever the pin is moved down into the lower portion of the slot. Both in the initial position and in the latching position of the lever, the pin is located in front of the hook, as viewed in the plug-in direction of the card.

Solely by this particular mounting of the lever and the location of mounting on the card is a definitive locking of the card in the latching position of the lever attained. Pulling at the front edge of the card will not cause the lever to move out of position and thereby separate the operative connection between the hook of the lever and the receptacle on the frame. Even if great tensional forces are exerted on the card, the card will remain in its fully plugged-in position.

An uncanted force transfer from the lever to the card is achieved according to one embodiment, in that the lever is U-shaped in cross section to embrace the forward edge of the card on both sides, and that the short lever arm terminates on each side in a hook and heel configuration.

According to one embodiment, the receptacles for the hooks are provided in a nose of the card guide, and the front face of the nose forms the front face against which the heels are bearing. This configuration has the advantage that the receptacles and the front surface are in an established position with respect to the card guide.

It is advantageous that the slots in the lever are so arranged that in the initial position of the lever the upper ends of the arcuate slots are at their smallest distance from the front edge of the card, and that in the latching position of the lever the lower ends of the slots are at their smallest distance from the front edge of the card, so as to occupy defined positions with respect to the card and to ensure the definitive latching.

If according to another embodiment of the invention, the side walls of the U-shaped lever, in the area of the free end of the longer lever arm, have sections of a reduced wall thickness and the inner confronting surfaces of these sections are provided with projections the spacing of which is less than the thickness of the card, then the lever is capable of also being attached to the front edge of a card removed from the card frame.

BRIEF DESCRIPTION OF THE DRAWING

The invention will now be further described, by way of illustrative and non-limiting example, with reference to the accompanying drawings, in which.

DESCRIPTION OF THE PREFERRED EMBODIMENTS

Figure 1:
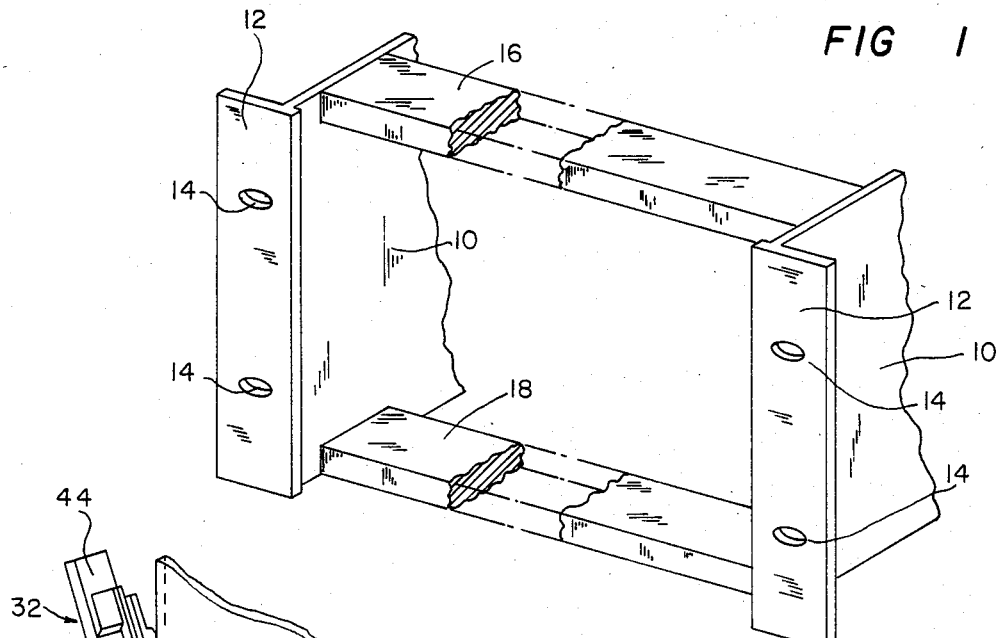
FIG. 1 is a front perspective view of a card frame.

FIG. 1 is a perspective view of a card frame that comprises a pair of pressure die cast metal side plates 10. Side plates 10 are preferably though not essentially, of identical construction. Side plates 10 have front mounting flanges 12 cast integrally therewith. By means of screws (not shown) passed through holes 14 in the flanges 12, the card frame (or sub-rack) can be installed in a rack or other housing in a manner known to those skilled in the art.

Side plates 10 are disposed in respective vertical planes and are joined together and spaced apart by a plurality of horizontally extending cross rails secured to side plates 10 by suitable means (not shown). Only upper front cross rail 16 and lower front cross rail 18 are shown in FIG. 1, and their configuration is somewhat simplifed in this figure for the sake of clarity. The card frame further comprises upper and lower rear cross rails (not shown). A plurality of card guides having upwardly open channels along the length thereof, the channels being defined by side walls 23, extend between the upper surfaces of the lower front and rear cross rails. One such card guide is shown as 20 in FIG. 2. Like card guides (not shown) having downwardly opening channels are mounted between the upper front and rear cross rails. The card guides associated with the upper cross rails and the lower cross rails are associated in vertically spaced pairs to receive circuit cards in a manner generally known in the art. The upper cross rails and card guides can be essentially the same as the lower ones, except of course for their orientation, whereby only the lower ones need be described. (The upper and lower cross rails are not necessarily disposed at the top and bottom of the card frames; rather, it is sufficient for the upper rails to be disposed nearer the top of the card frame than the lower rails). The card frame shown in FIG. 1 may be of generally the same form as that disclosed in our co-pending European patent application No. 82303338.6 (Publication No. EP 0 068 850 A).

Figure 2:
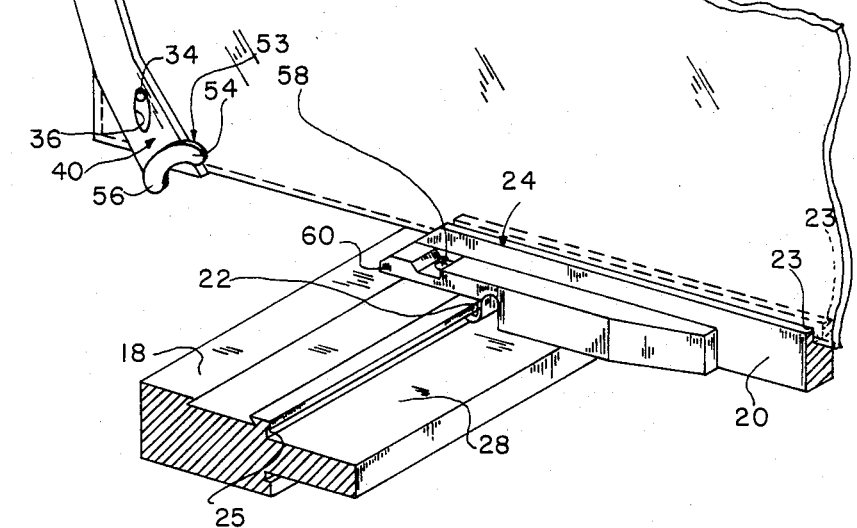
FIG. 2 is a rear perspective view of part of the card frame, showing a card ejector/injector mechanism thereof.

As best shown in FIG. 2 for the front end only, each end of card guide 20 is held in place on cross rail 18 by virtue of a resilient projection 22 of nose 24 of the card guide being located in groove 25 in the cross rail. Nose 24 is located in a desired position along the length of cross rail 18 by virtue of recesses 26 (FIG. 4) in the underside of nose 24 being engaged with selected ones of a plurality of spaced studs (not shown) disposed at regular intervals and at a desired spacing along the length of surface 28 of cross rail 18. The other end of card guide 20 is provided with a similar nose 24 located with respect to and held in place on the rear lower cross rail in a similar fashion. The upper card guides are held on the upper cross rails in a similar fashion. The whole arrangement may in fact be similar to lhat described in co-pending European patent application No. 82303336.0 (Publication No. EP 0 068 849 A).

Referring further to FIG. 2, a card comprising circuit board 30 is shown partially inserted into the card frame. That is to say, its lower edge is (as shown) located in the channel of card guide 20 and its upper edge (not shown) is similarly located in the channel of the associated upper card guide. At its rear edge board 30 is provided with a multi-pin plug which, when the card is pushed fully home, will in a manner known in the art engage with a corresponding multi-pin socket fixed to the rear of the card frame, for instance between the above mentioned rear cross rails or between further rear cross rails provided for that purpose.

A double-armed lever 32, which may be a unitary plastic molding, is pivotally mounted towards the lower front corner of board 30 by means of pin 34 fixed in the board and extending from both faces of the board through arcuate slot 36 formed through both of two upstanding side walls 38 of lever 32. The pivotal mounting defines a first, relatively short arm 40 and a second relatively long arm 42.

Figure 4:
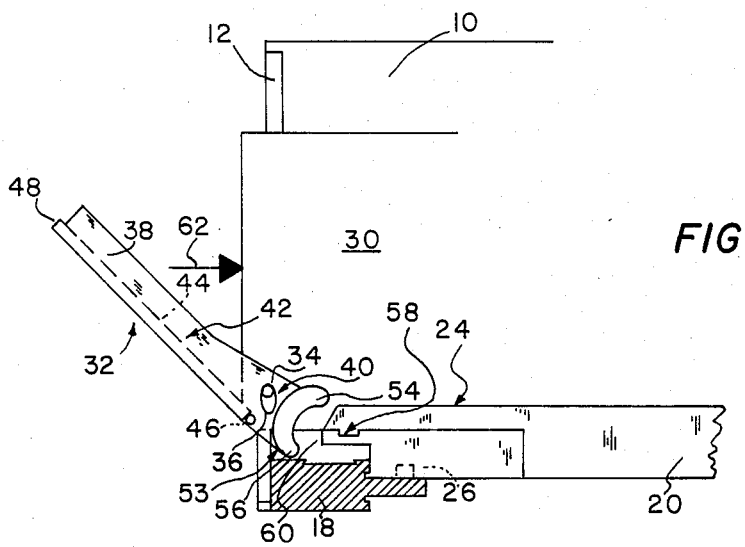
FIG. 4 is a side view of the mechanism with a card partially inserted, just prior to card injection.

Along the length of arm 42 upstanding side walls 38 are joined by base web 44. Web 44 terminates at edge 46 in the region of slot 36 whereby, as shown in FIG. 4, rest position of lever 32 is defined by edge 46 of web 44 resting against the front edge of board 30.

Towards the free end of arm 42, and short of the other end 48 of base web 44, side walls 38 are provided with portions 50 of reduced thickness and therefore enhanced resilience. (The resilience is preferably provided by the whole lever 32 being molded from a plastic material having some resilience). The facing interior surface of portions 50 are provided with projections 52.

At the free end of shorter arm 40 of lever 32, one of the side walls 38 is provided with a configuration 53 generally resembling the head of a spanner or wrench, configuration 53 comprising hook or claw 54 and heel 56. In a manner described hereinbelow, hook 54 can be engaged within recess 58 provided in nose 24 of card guide 20. Also in a manner described hereinbelow, heel 56 can be engaged with end face 60 of nose 24.

Figure 3:
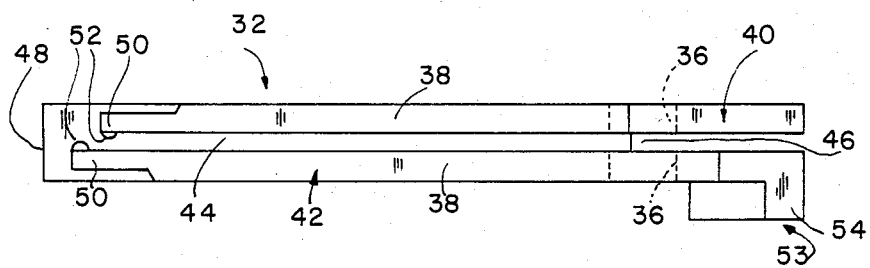
FIG. 3 is a side view of a lever of the mechanism of FIG. 2, taken in the direction of an arrow III in FIG. 2.

The mechanism just described with reference to FIGS. 2 and 3 can be used to inject the card (i.e. carrying out the final stage of insertion by effecting connection of the plug and socket) by forcing the card in with a lever action to overcome in a controlled manner the insertion force of the plug/socket arrangement, to eject the card (i.e. separate the plug and socket) by a lever action to overcome in a controlled manner the force opposing separation of the plug and socket, and to retain the card in place when it is full home. The manner of operation of the mechanism to perform these three functions will now be described with reference to FIGS. 4 to 8.

Figure 5:
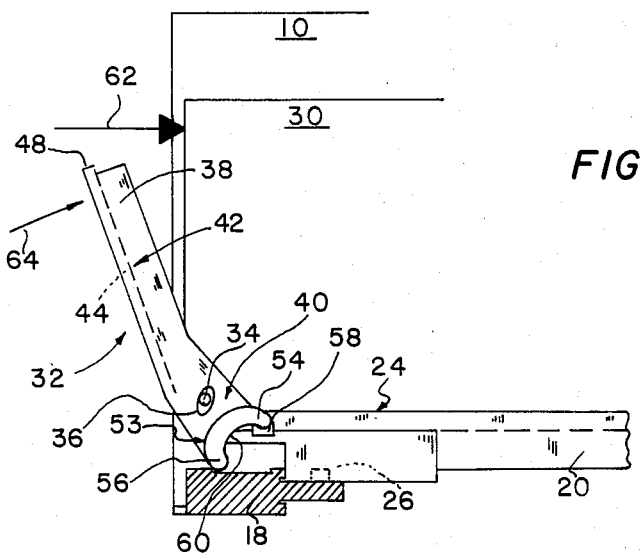
FIG. 5 is a side view of the mechanism in the course of card injection.
Figure 6:
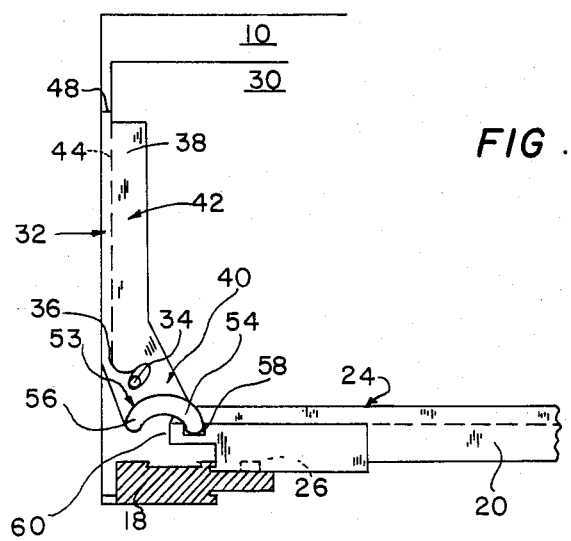
FIG. 6 is a side view of the mechanism with the card fully injected.

FIG. 4 shows the mechanism in the position it adopts when the card has been inserted most of the way into the card frame but the injection process has not yet commenced. Lever 32 is in the rest position described above with pin 34 at the top of slot 36, the angle of approach of the lever being determined by the relative positions of end edge 46 of web 44 and pin 34. As the card is moved further into the card frame, in the direction of arrow 62, heel 56 abuts front face 60 of nose 24, as shown in FIG. 5, whereby lever 32 starts to pivot in the manner indicated by arrow 64 in FIG. 5 and hook 54 moves down into recess 58. Pin 34 starts to move down slot 36. Force is then applied manually to arm 42 of lever 32 in the direction indicated by arrow 64. By virtue of engagement of hook 54 with recess 58, the whole lever 32 starts to pivot about the engaged hook and recess whereby a force is applied to board 30 via pin 34 to inject the card, i.e. to force it fully home against the insertion force required to cause mating of the plug and socket. The lever action is of course such as to provide a considerable mechanical advantage whereby the injection can be effected in a smooth and controlled manner. At the end of the injection operation, the parts are oriented as shown in FIG. 6, pin 34 being at the bottom of slot 36 and side walls 38 being disposed on opposite faces of board 30 with the front edge of the board abutting base web 44. The spacing between projections 52 (FIG. 3) of portions 50 of side walls 38 is rather less than the thickness of board 30 whereby portions 50 are resiliently deformed to cause projections 52 to grip the board between them. This gripping force must be overcome to enable lever 32 to be pivoted in the reverse direction to enable it to be pivoted sufficiently far away from board 30 to enable disengagement of hook 54 and projection 58 and therefore ejection of the card. Thus, the gripping force acts to retain the card in place against inadvertent ejection, as might for example be caused by vibration.

Figure 7:
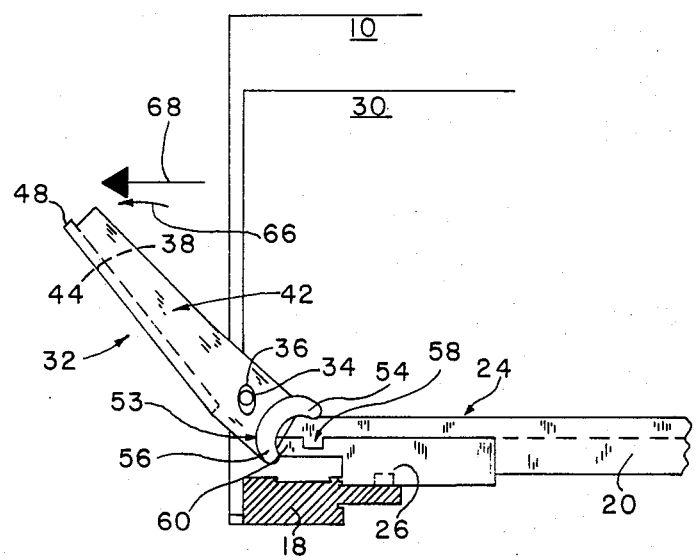
FIG. 7 is a side view of the mechanism with the card partially ejected.
Figure 8:
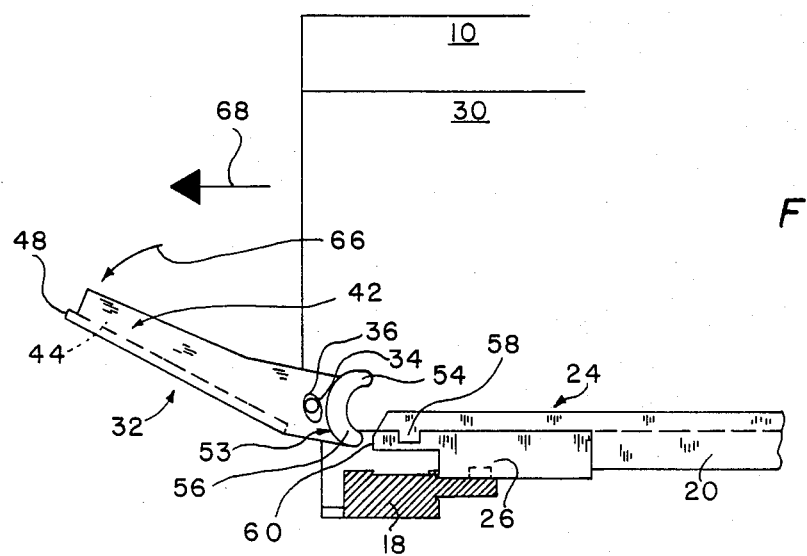
FIG. 8 is a side view of the mechanism with the card fully ejected (i.e. partially removed)

To eject the card, lever 32 is pivoted manually in an opposite direction, namely in the direction indicated by arrow 66 in FIG. 7. Hook 54 is thus disengaged from recess 58 to permit ejection. The pivotal movement of lever 32 causes heel 56 to be forced against end face 60 of nose 24 of card guide 20 thereby producing a lever action with a considerable mechanical advantage that subjects the card to an outward force (in the direction of an arrow 68 in FIG. 7) via pin 34 thereby causing a smooth and controlled ejection of the card, i.e. disconnection of the plug and socket connection. During this movement, pin 34 moves back up slot 36. FIG. 8 shows the situation in which ejection has been completed and lever 32 has nearly reverted to its original rest position shown in FIG. 5.

Figure 9:
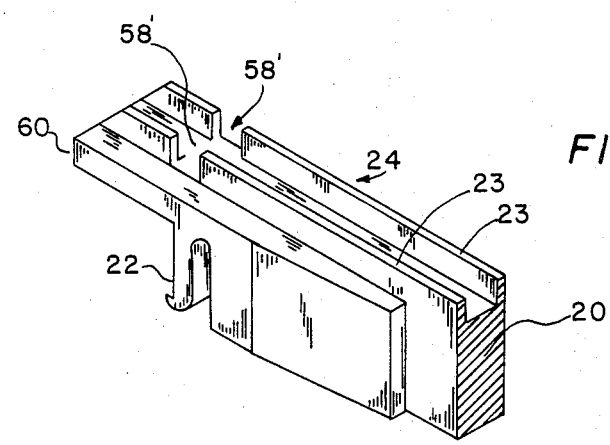
FIG. 9 is a view, corresponding to FIG. 2, of a card guide of another embodiment of an ejector/injector mechanism.

The invention can of course be carried into effect in other ways than that described above by way of example. For instance, the hook/heel configuration 53 at the free end of arm 40 of lever 32 could be duplicated such that a respective such configuration is disposed on each side of board 30. This has the advantage of subjecting pin 34 to equal forces on its opposite sides during injection and ejection of the card, thereby minimizing forces that might tend to warp or twist board 30 or move lever 32 out of alignment with the board. In such a symmetrical arrangement, heels 56 of the two configurations 53 would, as before, interact with end face 60 of nose 24 of card guide 20. However, recess 58 for interaction with hook or claw 54 would be replaced by a pair of recesses on opposite sides of board 30. As shown in FIG. 9, single recess 58 could be replaced by a pair of recesses 58′ formed by cut-out portions or slots in channel side walls 23. As will be apparent in particular from FIGS. 2 and 3, the twin configurations would in this case have to be arranged closer to board 30 than the single configuration 53 of the embodiment first described. The configurations could in fact be aligned with or constituted by the end portions of lever side walls 38, whereby, in spite of there being two configurations, the lever would be thinner than that of FIGS. 2 and 3.

We claim:

1. A card frame comprising a number of pairs of vertically spaced card guides for receiving cards provided with plug connectors, each pair of card guides being associated with a socket connector to establish electrical contact, a double-armed lever having a shorter lever arm and a longer lever arm, pivotally mounted on each card by means of a pin at the lower front corner of the card and adapted to be pivoted from out of an initial position oblique to a forward edge of said card, into a latching position in an abutting relationship with said forward edge of said card, said shorter lever arm terminating in a hook portion and a heel portion, with said hook portion being engageable with a receptacle fixed on the frame, as the card is inserted and the lever is pivoted upward into the latching position, the hook bearing against the receptacle counter to the direction of insertion of the card, said heel portion bearing against a front surface area of the frame as the lever is pushed downward into its initial position and the card is ejected; the improvement comprising said lever (32) being additionally adjustably mounted by having arcuate slots (36) and a pin (34) of said card (30) movably engaged therein, whereby in an initial position of said lever (32) said pin (34) bears against the upper ends of said slots (36) and in the latching position (FIG. 6) is moved down into the lower portions of said slots (36), and that in said initial position and in said latching position of said lever (32), said pin (34) is located in front of said hooks (54) as viewed in the plug-in direction of said card (30).

2. A card frame according to claim 1, characterized in having receptacles (58) for said hooks (54) provided in a nose (24) of said card guide (20), and a front face (60) of said nose (24) providing support for said heels (56).

3. A card frame according to claim 1, characterized in that in the initial position of said lever (32) the upper ends of said arcuate slots (36) are at their smallest distance from the front edge of said card (30), and that in the latching position of said lever (32) the lower ends of said slots (36) are at their smallest distance from the front edge of said card (30).

4. A card frame according to claim 1, characterized in that said lever (32) is U-shaped having side walls (38), said side walls (38) in the area of the free end of the longer lever arm portion (42), have sections (50) of reduced wall thickness, and the inner confronting surfaces of said sections (50) are provided with inwardly extending projections (52) the spacing of which is less than the thickness of said card (30).

5. A card frame according to claim 1, characterized in that said lever (32) is U-shaped in cross section to embrace the forward edge of said card (30) on both sides, and that the shorter lever arm (40) terminates on each side in a hook and heel member (53).

6. A card frame according to claim 5, characterized in that in the initial position of said lever (32) the upper ends of said arcuate slots (36) are at their smallest distance from the front edge of said card (30), and that in the latching position of said lever (32) the lower ends of said slots (36) are at their smallest distance from the front edge of said card (30).

7. A card frame according to claim 5, characterized in that said lever (32) is U-shaped having side walls (38), said side walls (38) in the area of the free end of the longer lever arm portion (42), have sections (50) of reduced wall thickness, and the inner confronting surfaces of said sections (50) are provided with inwardly extending projections (52) the spacing of which is less than the thickness of said card (30).

8. A card frame according to claim 5, characterized in having receptacles (58) for said hooks (54) provided in a nose (24) of said card guide (20), and a front face (60) of said nose (24) providing support for said heels (56).

9. A card frame according to claim 8, characterized in that said lever (32) is U-shaped having side walls (38), said side walls (38) in the area of the free end of the longer lever arm portion (42), have sections (50) of reduced wall thickness, and the inner confronting surfaces of said sections (50) are provided with inwardly extending projections (52) the spacing of which is less than the thickness of said card (30).

10. A card frame according to claim 8, characterized in that in the initial position of said lever (32) the upper ends of said arcuate slots (36) are at their smallest distance from the front edge of said card (30), and that in the latching position of said lever (32) the lower ends of said slots (36) are at their smallest distance from the front edge of said card (30).

11. A card frame according to claim 10, characterized in that said lever (32) is U-shaped having side walls (38) in the area of the free end of the longer lever arm portion (42), having sections (50) of reduced wall thickness, and the inner confronting surfaces of said sections (50) are provided with inwardly extending projections (52) the spacing of which is less than the thickness of said card (30).

* * * * *